United States Patent [19]

Chern et al.

[11] Patent Number: 5,032,892
[45] Date of Patent: Jul. 16, 1991

[54] DEPLETION MODE CHIP DECOUPLING CAPACITOR

[75] Inventors: Wen-Foo Chern; Ward M. Parkinson; Thomas M. Trent; Kevin G. Duesman; James E. O'Toole, all of Boise, Id.

[73] Assignee: Micron Technology, Inc., Boise, Id.

[21] Appl. No.: 453,861

[22] Filed: Dec. 20, 1989

Related U.S. Application Data

[63] Continuation-in-part of Ser. No. 200,673, May 31, 1988, abandoned.

[51] Int. Cl.⁵ .................. H01L 27/02; H01L 29/68; H01L 27/02
[52] U.S. Cl. ...................... 357/51; 357/236; 357/23.13; 357/40; 357/42
[58] Field of Search .............. 357/51, 23.13, 23.6, 357/40, 42, 45, 74

[56] References Cited

U.S. PATENT DOCUMENTS

| | | | |
|---|---|---|---|
| 4,164,751 | 8/1979 | Tasch, Jr. | 357/23.6 |
| 4,317,686 | 3/1982 | Ananad et al. | 357/91 |
| 4,427,989 | 12/1984 | Nantha et al. | 357/21 |
| 4,604,639 | 8/1988 | Kinoshita | 357/23.6 |
| 4,670,861 | 12/1987 | Shie et al. | 365/182 |
| 4,701,884 | 10/1987 | Aoki et al. | 365/189.09 |
| 4,737,830 | 4/1988 | Patel et al. | 357/23.6 |
| 4,780,846 | 10/1988 | Tanabe et al. | 357/45 |
| 4,879,631 | 11/1989 | Johnson et al. | 361/386 |

FOREIGN PATENT DOCUMENTS

| | | | |
|---|---|---|---|
| 58-77251 | 5/1983 | Japan | 357/51 |
| 64-10663 | 1/1989 | Japan | 357/51 |

Primary Examiner—J. Carroll
Attorney, Agent, or Firm—Stanley N. Protigal

[57] ABSTRACT

An integrated ciruucit is provided with a depletion mode filter capacitor, which reduces voltage spiking, while at the same time avoiding latchup problems caused by the capacitor. The depletion mode capacitor has a barrier layer which is doped to an opposite conductivity type as the integrated circuit's substrate, achieved by doping to provide an opposite difference from four valence electrons as the substrate. The barrier is formed as a part of a CMOS process, in a manner which avoids additional process steps. The capacitor is formed with one node connected to ground or substrate, and the other node directly to a power bus. The capacitor is located on open space available on the whole siliocn chip (memory as well as logic chip), particularly directly underneath the metal power bus to achieve an on-chip power bus decoupling capacitor wth capacitance in excess of 0.001 μF.

39 Claims, 10 Drawing Sheets

DEPLETION MODE CHIP DECOUPLING CAPACITOR

CROSS REFERENCE TO RELATED APPLICATION

This is a continuation-in-part of U.S. patent application Ser. No. 07/200,673, filed May 31, 1988, abandoned, entitled Chip Decoupling Capacitor.

FIELD OF THE INVENTION

This invention relates to semiconductor devices, and more specifically to circuit connections on semiconductor devices and to the reduction of voltage transients on the semiconductor devices.

BACKGROUND OF THE INVENTION

Most semiconductors, including all DRAMS, include capacitors. For example, a 16 Meg DRAM includes over 16 million capacitors each. For the purpose of storing individual bits of information, these capacitors are accessed by connections through access transistors and sense amps, connected through a periphery circuit.

CMOS technology, with low static power consumption and high speed, has become the technology of choice for almost all VLSI applications. Because it employs both p-channel and N-channel MOS transistors, parasitic NPN and PNP bipolar transistors are formed. Together they form the PNPN layer which is commonly known as the silicon-controlled rectifier (SCR); they stay on once they have been turned on. This mode is known as "latchup" and can be self-destructive because excessive currents can flow through the junctions. The reduction in dimensions further accentuates this parasitic component responsible for a self-destructive mode.

In order to model latchup, it is convenient to use the four-layer configuration as two coupled transistors, shown in FIGS. 1. As illustrated in FIG. 1A, a p+ source/drain and a p substrate form the emitter and collector regions of a vertical PNP transistor, schematically shown as Q1. An n+ source/drain and an n-well form a lateral NPN transistor, schematically shown as Q2. The parasitic vertical PNP and lateral NPN bipolar transistors Q1, Q2 can introduce latchup if either of the base-emitter junctions becomes forward biased. The parasitics can be described as a four layer P+NPN+ diode called a silicon-controlled rectifier (SCR). The SCR's operation depends on an internal feedback mechanism triggered by operating voltage above VCC or below ground; by internal thresholds; by radiation-induced currents; or by photo excitation.

A p-channel device will latchup when its source or drain is forced above VCC with a charge current, called the trigger current. This current causes Q1 to become forward biased and to turn on. Referring to FIG. 1B, Q1's collector current, ICI, now feeds with the base of Q2 (IB2) and the parasitic resistor R2. Since R2 pulls base current from Q2, it causes a voltage to appear at Q2's base. When this potential reaches the range of 0.6 to 0.7 volts (1NPN×R2), Q2 turns on and begins to feed current into R1 and Q1's base. This latchup loop will continue until voltage is removed or the circuit self destructs.

An n-channel device will latchup when its source or drain voltage is forced below $V_{SS}$ and a similar process begins at Q2. The current required to initiate latchup can be expressed in terms of the fundamental transistor parameter alpha ($\alpha$). The variation of alpha is a fundamental feature of the SCR.

U.S. Patent application Ser. No. 07/200,673 describes a semiconductor circuit device in which border areas, including perimeter border areas and intermediate border areas, are capacitors. The filter capacitors are in electrical communication with lead frame connection pads, to which the lead frame connection wires are attached. This establishes a filter capacitance in excess of 0.001 $\mu$F on the semiconductor device side of the lead frame connection wires, thereby filtering voltage transients which may be generated by the lead frame connection wires.

Latchup can occur in a capacitor as a result of a short from gate to substrate. The short may be due to gate—oxide breakdown in the field over time.

In order to reduce latchup, it is possible to form the capacitor with a barrier to substrate. This forms a depletion mode capacitor. A depletion mode capacitor has a top plate (sometimes called a gate) over a depletion region of the substrate or bottom plate. The depletion region is so-called because there is a depletion of mobile carriers (electrons or holes). Charge is uncovered across the depletion, and the resulting field rapidly sweeps any charge which enters into the depletion region across the region.

The result of the depletion region in the capacitor is that the capacitor accepts charge at low voltage and has equal depletion depths across the capacitor. More importantly, the capacitor is less likely to cause latchup.

FIGS. 2 show the formation of a barrier layer under the capacitor in the left side of the drawings. A depletion region 2 is implanted through isolation oxide 3, followed by deposition of gate polysilicon 4. Active areas 5 are then implanted. On the right side, no barrier is implanted under the gate poly 4, but active areas 6 are implanted. The depletion region normally requires a separate mask step and implant step.

SUMMARY OF THE INVENTION

In accordance with the present invention, a large area on-chip capacitor is provided with a barrier to substrate. The barrier consists of a material of opposite conductivity type as the substrate, achieved by doping to provide an opposite difference from four valence electrons as the substrate. Thus, if the substrate at the capacitor is p-type silicon, indicating silicon doped with atoms having less than four valence electrons (group III or lower), the barrier would be a layer of substrate which is counterdoped sufficiently to be n-type silicon. In other words the barrier would be substrate material composed of silicon that has been doped with atoms having more than four valence electrons (group V or higher), such as arsenic, which introduce negatively charged majority carriers into the silicon. Conversely, if the substrate is n-type, indicating an excess of "negative" carriers (electrons) in the material, the barrier is p-type, indicating material with an excess of "positive" carriers, or "holes". The p-type barrier may be obtained by counterdoping the substrate material with atoms having less than four valence electrons (group III or lower), such as boron or phosphorus, which introduce positively charged majority carriers.

The barrier is obtained in CMOS process without adding additional steps. The barrier is obtained by using the N-well definition step which is a normal part of the CMOS process.

Normally in a CMOS process, one would not form an N-well underneath a transistor channel, even for the capacitor. Here we are using it as a barrier under the gate to prevent latchup should the gate oxide breaks down. This:

1) Includes a barrier under the capacitor gate as an latchup protection as we are currently filing.

2) Uses N-well definition to form the barrier, thereby avoiding additional process step to define the barrier.

The barrier prevents the gate of a capacitor from shorting to the substrate, should the dielectric layer of the capacitor break down. This also prevents the capacitor from causing latchup in the integrated circuit.

DETAILED DESCRIPTION OF THE PREFERRED EMBODIMENTS

Figure 1A:
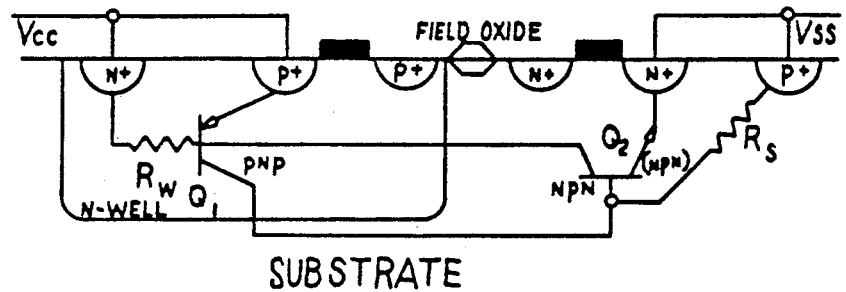
FIGS. 1A and 1B (prior art) show two coupled transistors, in which a p+ source/drain and a p substrate form the emitter and collector regions of a vertical PNP transistor.
Figure 1B:
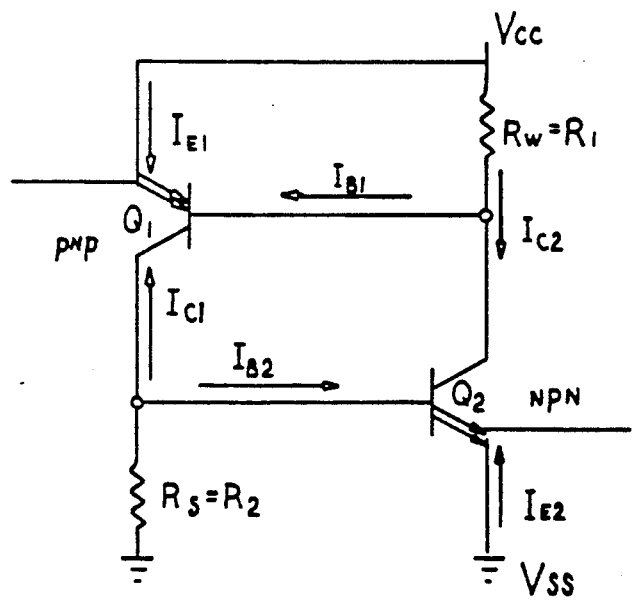
Figure 2A:
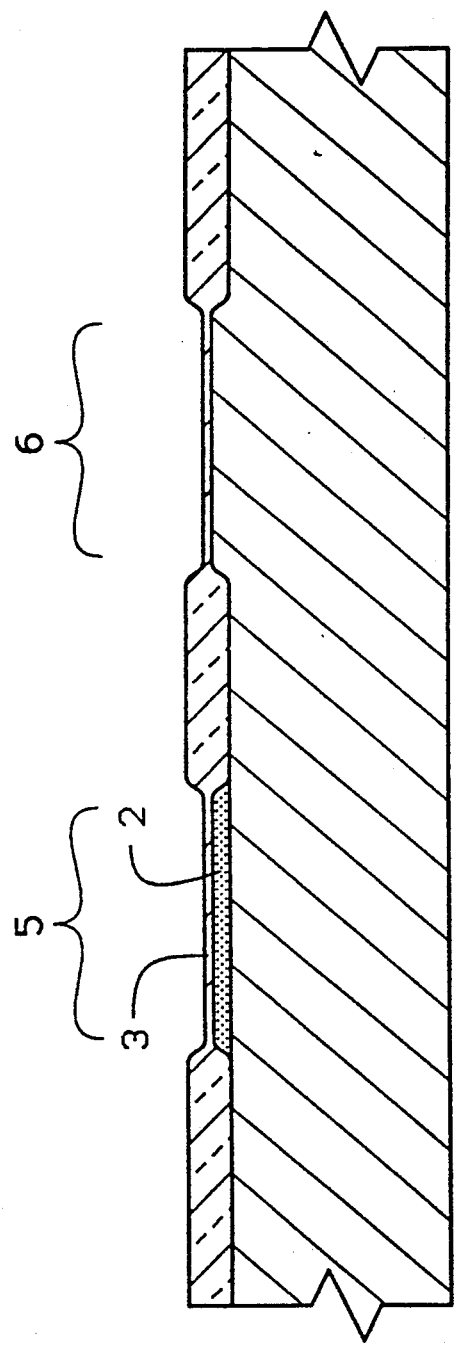
FIGS. 2A, 2B and 2C (prior art) show cross sections of semiconductor wafers, and the formation of a barrier layer under a capacitor.
Figure 2B:
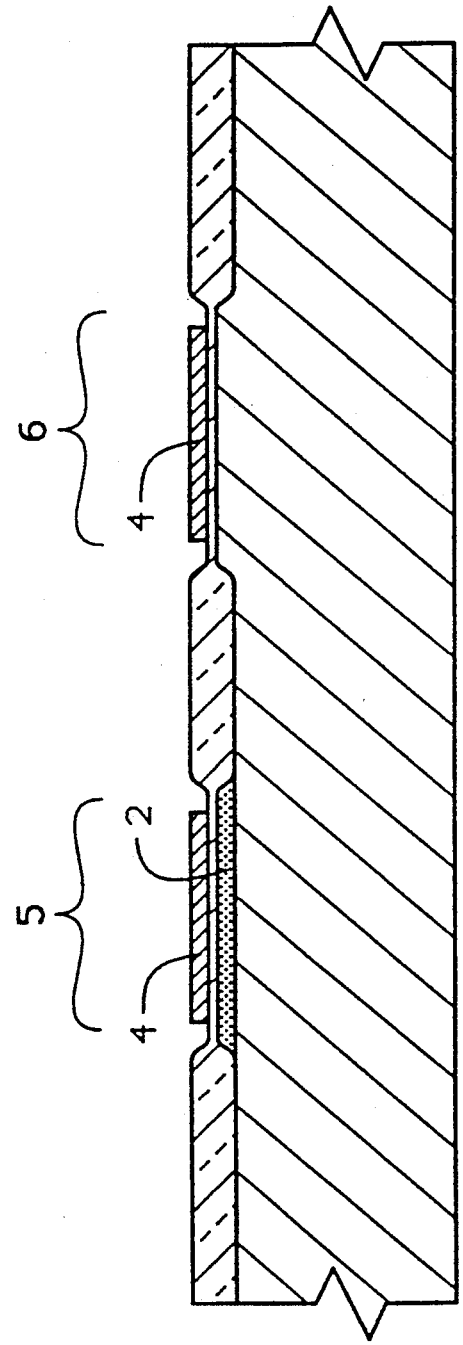
Figure 2C:
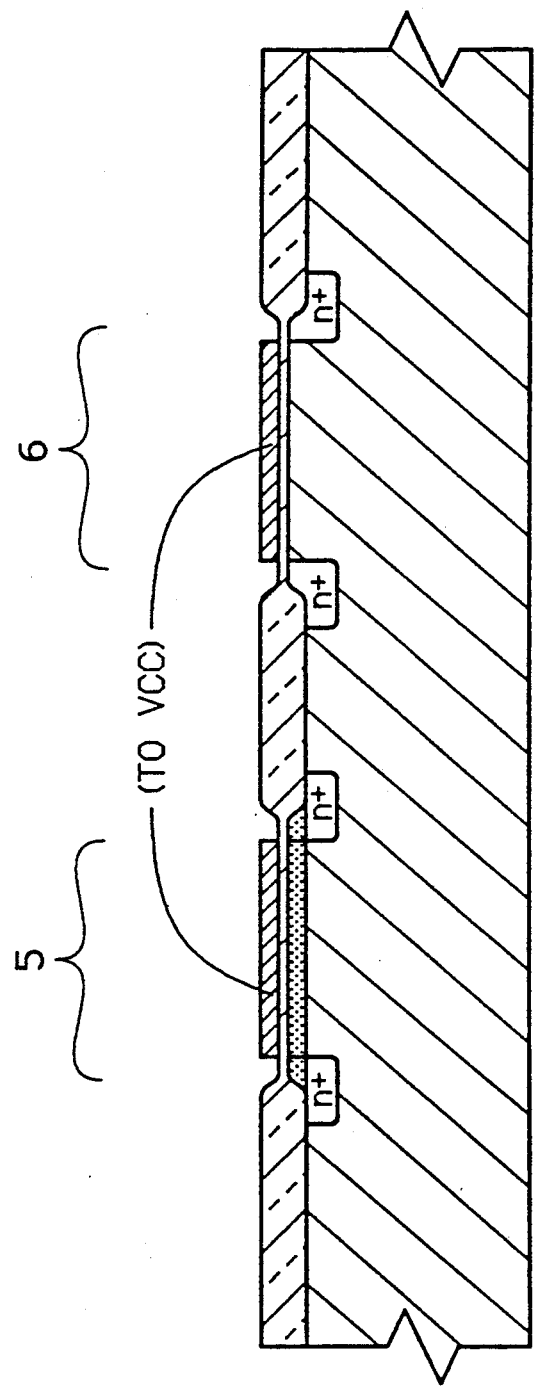
Figure 3:
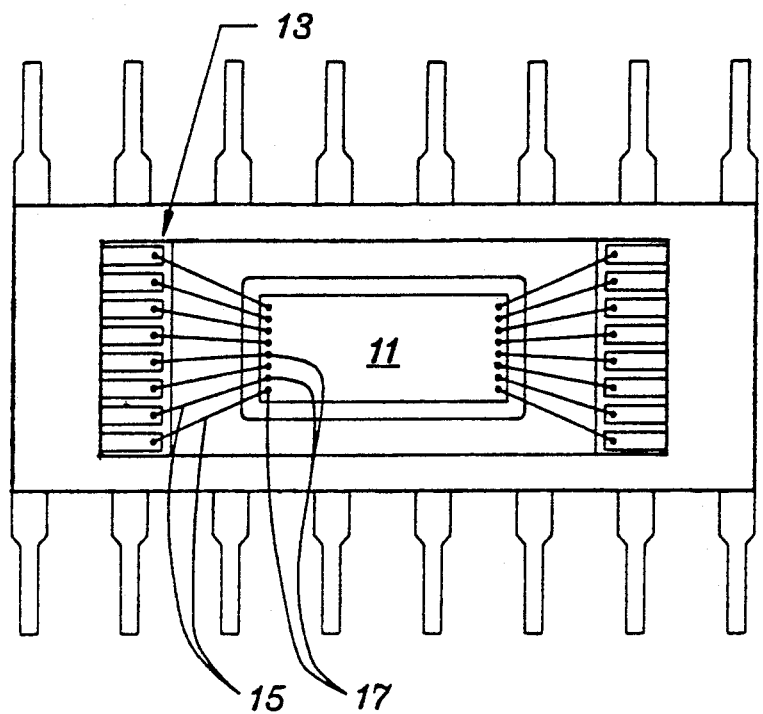
FIG. 3 (prior art) shows a top view of a semiconductor mounted onto a lead frame.
Figure 4:
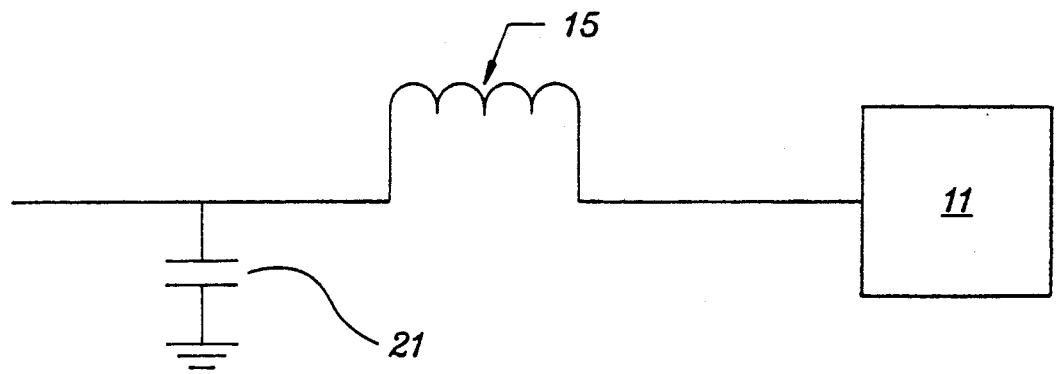
FIG. 4 (prior art) shows an equivalent circuit of a semiconductor device connected to a lead wire and an off-chip capacitor.
Figure 5:
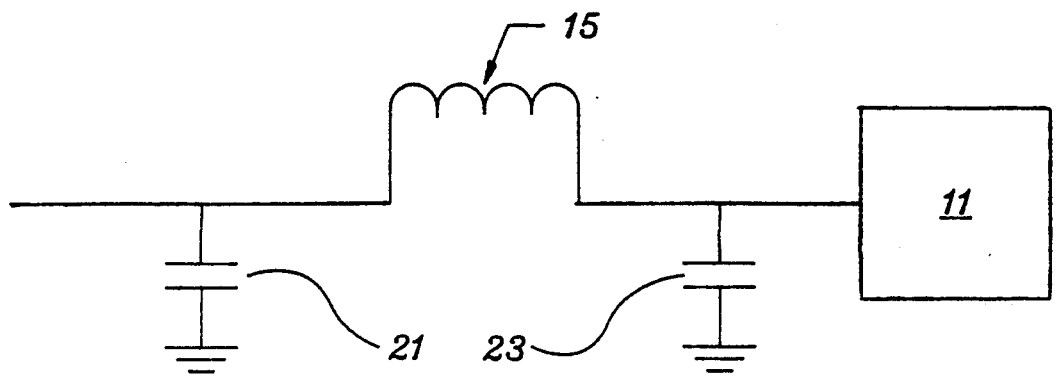
FIG. 5 shows an equivalent circuit of a semiconductor circuit device connected through a lead frame connection wire and having an on-chip decoupling capacitor.

As shown in FIGS. 3-5, a semiconductor device includes a die 11 which is connected to a lead frame 13 by a plurality of lead wires 15. The lead wires 15 are attached to the die 11 at pads or contact points 17. The lead wires 15 function as inductors, as schematically shown in FIGS. 3 and 4. While an external capacitor 21 is often provided, appropriate filter capacitance would be located on the die side of the lead wire 15, as schematically shown in FIG. 5 at 23.

Figure 6:
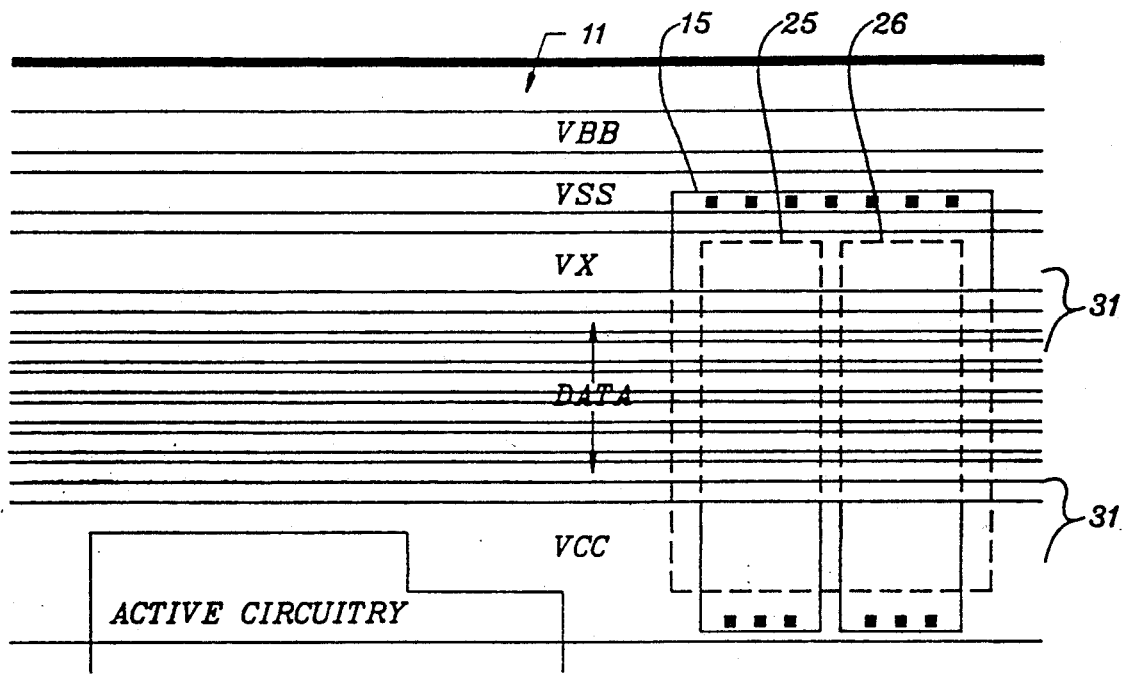
FIG. 6 shows a top view of a portion of a semiconductor, which incorporates a decoupling capacitor.

FIG. 6 shows details of one end of the die 11 constructed according to the present invention, a pair of capacitors are defined by an active area of the substrate 15 and a polysilicon (poly) layer which is formed into strips 25, 26. The active area 15 is in electrical communication with a first bus line Vss. The poly strips 25, 26 are in electrical communication with a second bus line $V_{CC}$. Oxide is used to separate the Poly 25, 26 from the active area 15.

The capacitors defined by the strips 25, 26 are on a location of the circuit die 11 which underlies $V_X$ and $V_{CC}$, as well as other buses 31. The buses 31 (including $V_X$ and $V_{CC}$) are typically metallization layers, and real estate occupied by the buses 31 cannot be used for most active circuitry. This is because active circuitry requires utilization of layers as outputs, which in this case is prevented by the buses 31 which are used for routing signals across the chip.

Figure 7:
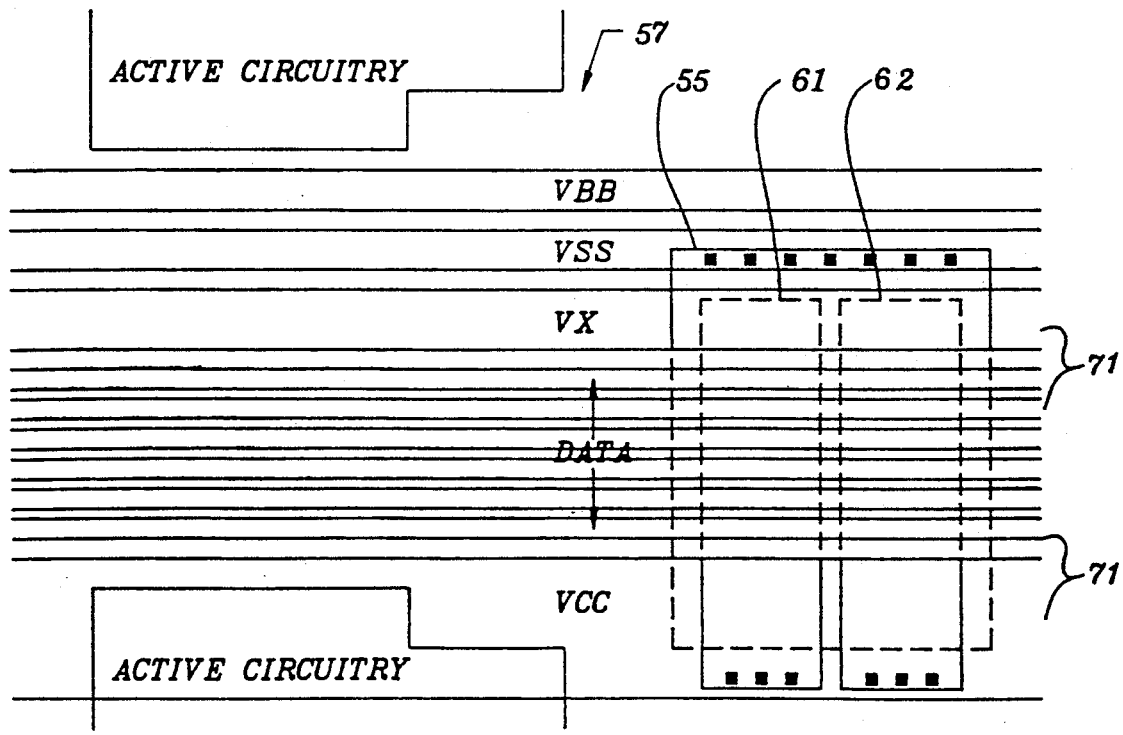
FIG. 7 shows a top view of a portion of a semiconductor device, in which a decoupling capacitor is placed along an intermediate boundary area of the chip architecture.

FIG. 7 shows a configuration in which a pair of capacitors are defined by an active substrate area 55 along an intermediate portion of a semiconductor die 57. A plurality of poly strips 61-62, superimposed over the active poly area define a plurality of capacitors. Circuit buses 71 are superimposed over the capacitors 61-62, so that the capacitors 61-62 do not occupy real estate that could be used for other active circuit devices.

The invention has been described in terms of connection to circuit busses which have external connections. It is possible that an additional circuit may be placed between the bus and an external connection. A likely example of such an additional circuit would be a voltage regulating circuit. It is possible to connect the capacitor to a bus which extends between such an additional circuit and a main portion of the integrated circuit device.

Figure 8:
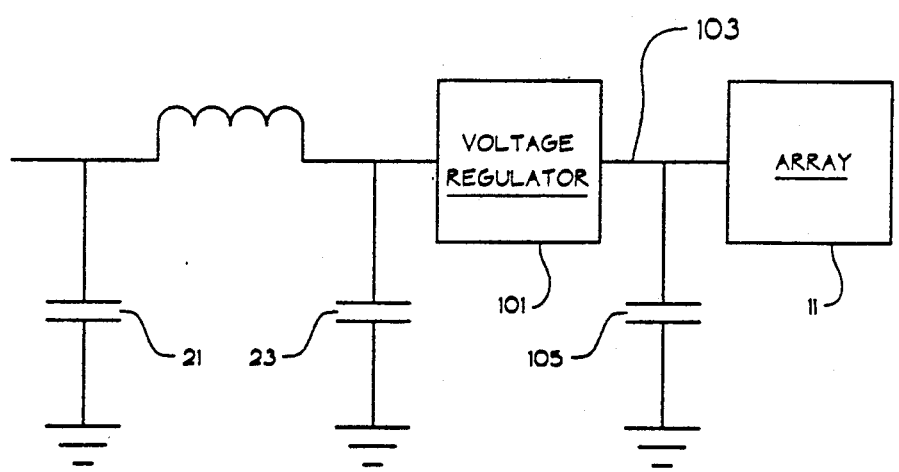
FIG. 8 shows the use of the invention with an on-chip regulated voltage circuit.

Referring to FIG. 8, it is possible to provide semiconductor devices which include a voltage regulator circuit 101. The voltage regulator circuit 101 provides current to a regulated conductive line 103 at a regulated potential $V_{CC\ reg}$. $V_{CC\ reg}$ is supplied to a regulated conductive line extending along the substrate between an active device and the voltage regulator circuit. This type of device may, of course, include the capacitor 23 between substrate and $V_{CC}$. In addition, a capacitor 105 may be placed between substrate and the regulated conductive line. This capacitor would occupy space defined by a plurality of the conductive lines, and be in electrical communication with the regulated conductive line.

Figure 9:
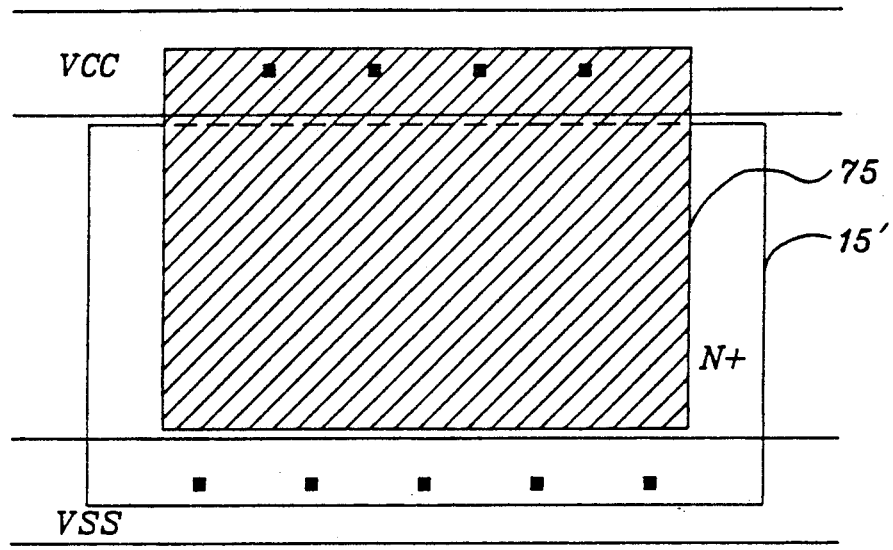
FIGS. 9 and 10 show connection arrangements for N-channel and P-channel capacitor, respectively.
Figure 10:
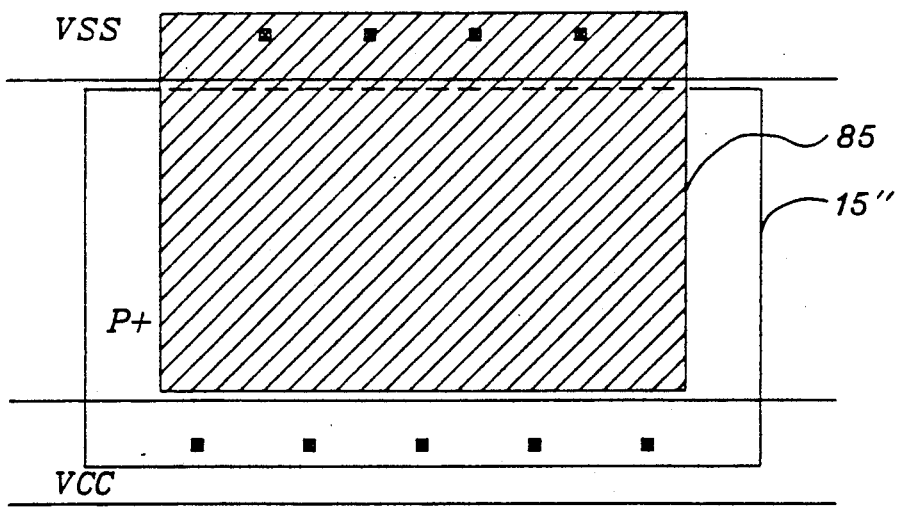

The present embodiment contemplates the use of n channel capacitors, using a p type substrate. This is shown in FIG. 9. It is possible to construct p channel capacitors, with $V_{CC}$ connected to active area 15" and Vss connected to poly 85. This is shown in FIG. 10. Each of these is a depletion mode capacitor, which has a preferential voltage polarity.

Figure 11:
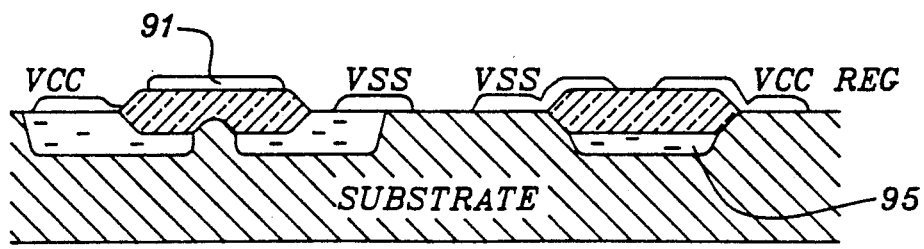
FIG. 11 shows a cross-sectional view of an arrangement in which two capacitors are connected in series in order to increase breakdown voltage.

It may also be the case that two capacitors may be connected in series in order to increase the total breakthrough voltage of the combined capacitors. Enhancement mode capacitors require adjustment for their preferential voltage polarity. This can be accomplished through interconnects or similar means. Depletion mode capacitors, on the other hand, have less preferential voltage polarity. If the capacitors are not polarization sensitive, then the capacitors can have a common poly plate 91 or a common active area 95, as schematically shown in FIG. 11.

The n doped barrier under the n channel capacitor gate can be introduced in several ways. If using an n-type depletion implant, one must have a special depletion implant process step to deplete the channel in order to have the capacitor permanently "turn on" at all anticipated gate potentials, including negative gate potentials.

Figure 12A:
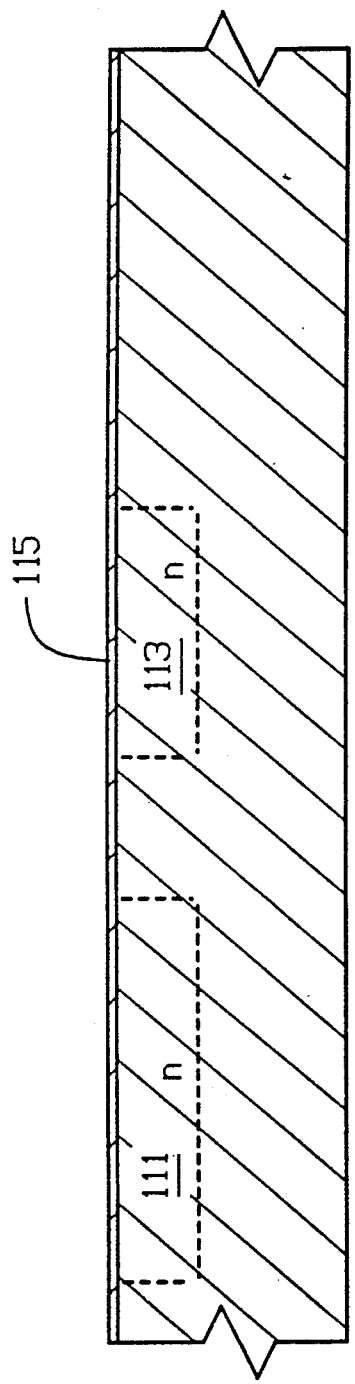
FIGS. 12A, 12B, and 12C schematically depict a CMOS process used to form an n type doped barrier during an n well implant step.
Figure 12B:
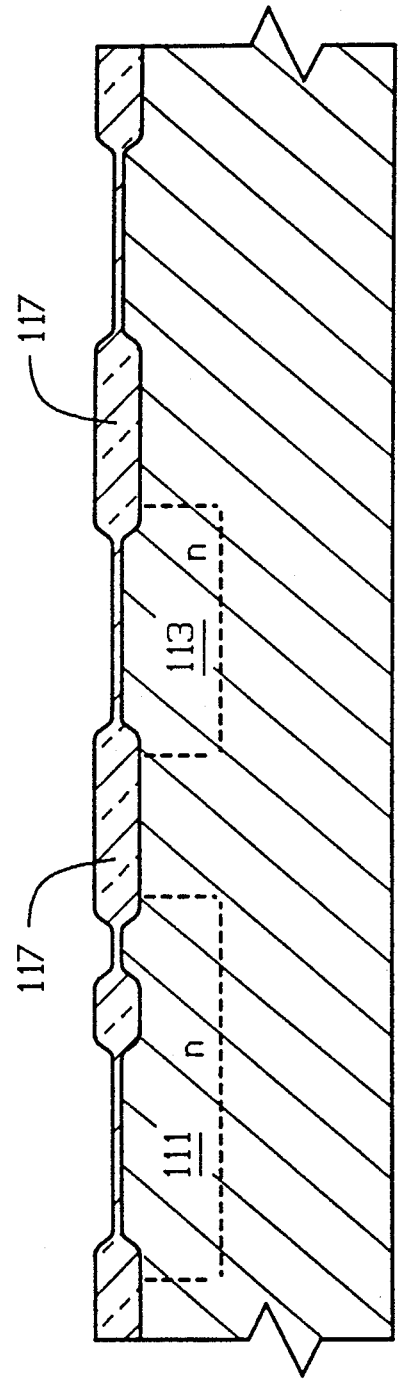
Figure 12C:
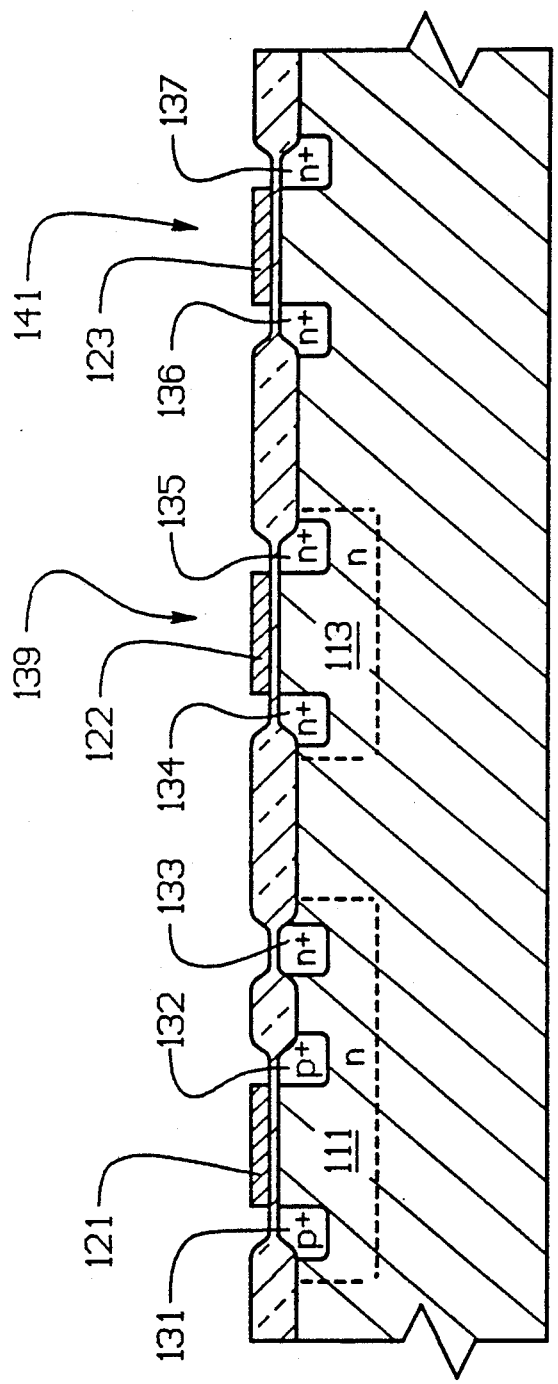

As shown in FIG. 12, a separate depletion mask is not needed in a CMOS process because one can introduce n-type doping to form the n doped barrier during the n well implant step. In FIGS. 12, the left side shows transistor formation and the right and center show capacitor formation wells 111 and 113 are implanted through initial oxide 115, as shown in FIG. 12A. n well 111 is a standard CMOS n well, and n well 113 will form a barrier for a depletion mode capacitor (139, FIG. 12C). Field oxide 117 is grown, as shown in FIG. 12B, followed by deposition of gate polysilicon 121-123, shown in FIG. 12C.

After implanting active area implants 131-137, we see that a depletion mode capacitor 139 is formed at n well 113. An enhancement mode capacitor 141 is formed without a barrier where no n well is implanted.

Figure 13:
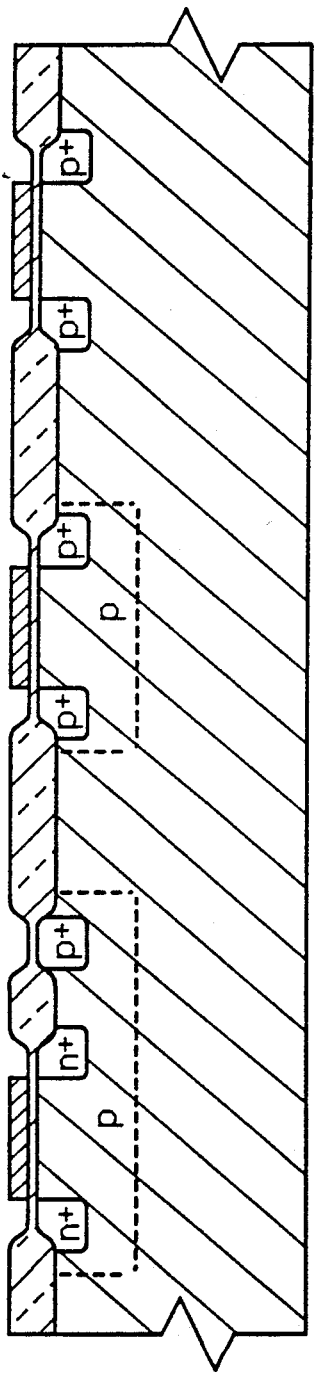
FIG. 13 schematically depicts the formation of a p type barrier.

It is also possible to use a p-doped barrier under n channel capacitor gates, where a p-type depletion implant would be used (FIG. 13). In this case, the n-type starting material would be doped as a p-type depletion implant. In a CMOS process using p wells, this can be done simultaneously with the p well implant step.

In a CMOS process using p wells on an n-type substrate, the extra well, which would be a p well would also result in a depletion mode capacitor, because the depletion mode relates to mobile carriers, rather than specifically to electrons or holes. In other words, the configuration would be that of FIG. 13, which is the same as shown in FIGS. 12, but with opposite "p's" and "n's".

We claim:

1. A semiconductor circuit device in which a plurality of active circuit devices are arrayed on a semiconductive substrate in a CMOS configuration, and a plurality of conductive lines extend along the substrate between the active devices and external connection points on the die containing the semiconductor substrate, within a package containing external connection conductors extending within the package from the external connection points and having a significant inductive characteristics, characterized by:
   a) at least one well consisting of a material of opposite conductivity type as the substrate, achieved by doping to provide an opposite difference from four valence electrons as the substrate;
   b) a capacitor defined by an active area of the substrate and a polysilicon layer;
   c) the capacitor being provided with a barrier to substrate, the barrier consisting of a material of opposite conductivity type as the substrate, achieved by providing said capacitor within said well which had been doped to provide an opposite difference from four valence electrons as the substrate, whereby said doped well forms said barrier, the barrier being located in the substrate under the polysilicon layer of the capacitor and under the active area of the substrate at the capacitor as latchup protection;
   d) the capacitor occupying a space defined by a plurality of the conductive lines;
   e) the capacitor being in electrical communication with at least one of said lines, wherein the capacitor is located on the substrate in an area which is unoccupied by said active circuit devices, wherein one node is tied directly to substrate and the other node to one of said plurality of conductive lines as an on-chip power bus decoupling capacitor, thereby adding filter capacitance to the semiconductor circuit device in order to provide protection from voltage transients which may occur at the external connection points as a result of said inductive characteristics of the external connection conductors;
   f) said conductive lines being circuit busses for circuits on the semiconductor device;
   g) said conductive lines being metal conductors;
   h) one of said conductive lines being maintained at a regulated potential;
   i) an additional capacitor located on the substrate in an area which is unoccupied by said active circuit device and connected in series with said capacitor in electrical communication with said conductive line which is maintained at the regulated potential; and
   j) the additional capacitor sharing a common electrode plate which extends across said unoccupied area between the two capacitors.

2. Semiconductor circuit device as described in claim 1, further characterized by:
   a) the barrier being obtained by using an n-well definition step in a CMOS process;
   b) the semiconductor substrate being p-type silicon; and
   c) the barrier being a layer of substrate which is counterdoped sufficiently to be n-type silicon.

3. Semiconductor circuit device as described in claim 1, further characterized by:
   a) the barrier being obtained by using a p-well definition step in a CMOS process;
   b) the semiconductor substrate being n-type silicon; and
   c) the barrier being a layer of substrate which is counterdoped sufficiently to be p-type silicon.

4. Semiconductor circuit device as described in claim 1, further characterized by:
   the capacitor being in electrical communication between two of said conductive lines, wherein both of said lines remains in electrical communication with the external connection points, and wherein the capacitor filters inductively induced transients on the semiconductor device during the operation of the semiconductor circuit device.

5. Semiconductor circuit device as described in claim 1, further characterized by:
   the semiconductor circuit device including a randomly accessed memory array, in which stored data is communicated by high and low state signals and said capacitor is connected between a $V_{SS}$ circuit and a $V_{CC}$ circuit.

6. Semiconductor circuit device as described in claim 1, further characterized by:
   a) said active circuit devices and said conductive lines being located on a face side of the substrate of the semiconductor circuit device; and
   b) said capacitor being located on the face side.

7. Semiconductor circuit device as described in claim 6, further characterized by:
   said capacitor being located on a portion of the semiconductor circuit device which is at a perimeter of the substrate.

8. Semiconductor circuit device as described in claim 1, further characterized by:
   said capacitor being located on a portion of the semiconductor circuit device which is in a border area between adjacent regions of active circuitry on the semiconductor device.

9. Semiconductor circuit device as described in claim 1, further characterized by:
   said capacitors being depletion mode capacitors.

10. A semiconductor dynamic random access memory (DRAM) circuit device in which a plurality of active circuit devices are arrayed on a semiconductive substrate and a plurality of conductive lines extend along the substrate between the active devices and external connection points on the die, containing the semiconductor substrate, within a package containing external connection conductors extending within the package from the external connection points and having a significant inductive characteristics, characterized by:
   a) a voltage regulator circuit;
   b) a regulated conductive line extending along the substrate between an active device and the voltage regulator circuit;
   c) at least one well consisting of a material of opposite conductivity type as the substrate, achieved by doping to provide an opposite difference from four valence electrons as the substrate;
   d) a capacitor defined by an active area of the substrate and a polysilicon layer;
   e) the capacitor being provided with a barrier to substrate, the barrier consisting of a material of opposite conductivity type as the substrate, achieved by providing said capacitor within said well which had been doped to provide an opposite difference from four valence electrons as the substrate, whereby said doped well forms said barrier;
   f) the capacitor occupying a space defined by a plurality of the conductive lines;
   g) the capacitor being in electrical communication with said regulated conductive line, wherein the capacitor is located on the substrate in an area which is unoccupied by said active circuit devices, wherein one node is tied directly to substrate and the other node to the regulated conductive line as an on-chip power bus decoupling capacitor, thereby adding filter capacitance to the semiconductor circuit device in order to provide protection from voltage transients which may occur at the external connection points as a result of said inductive characteristics of the external connection conductors;
   h) an additional capacitor located on the substrate in an area which is unoccupied by said active circuit device and connected in series with said capacitor in electrical communication with said regulated conductive line;
   i) the additional capacitor sharing a common electrode plate which extends across said unoccupied area between the two capacitors; and
   j) said capacitors being depletion mode capacitors.

11. Semiconductor circuit device as described in claim 10, further characterized by:
   the barrier being located under said polysilicon layer which defines the capacitor, as latchup protection.

12. Semiconductor circuit device as described in claim 10, further characterized by:
   a) the semiconductor substrate being p-type silicon; and
   b) the barrier being a layer of substrate which is counterdoped sufficiently to be n-type silicon.

13. Semiconductor circuit device as described in claim 10, further characterized by:
   a) the semiconductor substrate being n-type silicon; and
   b) the barrier being a layer of substrate which is counterdoped sufficiently to be p-type silicon.

14. Semiconductor circuit device as described in claim 10, further characterized by:
   said conductive lines being metal conductors.

15. Semiconductor circuit device as described in claim 14, further characterized by:
   a) said active circuit devices and said conductive lines being located on a face side of the substrate of the semiconductor circuit device; and
   b) said capacitor being located on the face side.

16. Semiconductor circuit device as described in claim 15, further characterized by:
   said capacitor being located on a portion of the semiconductor circuit device which is at a perimeter of the substrate.

17. Semiconductor circuit device as described in claim 15, further characterized by:
   said capacitor being located on a portion of the semiconductor circuit device which is in a border area of active circuitry on the semiconductor device.

18. A semiconductor circuit device in which a plurality of active circuit devices are arrayed on a semiconductive substrate, characterized by:
   a) at least one well consisting of a material of opposite conductivity type as the substrate, achieved by doping to provide an opposite difference from four valence electrons as the substrate;
   b) a capacitor defined by an active area of the substrate and a polysilicon layer;
   c) the capacitor being provided with a barrier to substrate, the barrier consisting of a material of opposite conductivity type as the substrate, achieved by providing said capacitor within said well which had been doped to provide an opposite difference from four valence electrons as the substrate, whereby said doped well forms said barrier;
   d) the barrier being located in the substrate under the polysilicon layer of the capacitor and under the active area of the substrate at the capacitor as latchup protection;
   e) an additional capacitor located on the substrate in an are which is unoccupied by said active circuit device and connected in series with said capacitor in electrical communication with a conductive line which is maintained at a regulated potential; and
   the additional capacitor sharing a common electrode plate which extends across said unoccupied area between the two capacitors.

19. Semiconductor circuit device as described in claim 18, further characterized by:
   a) the barrier being obtained by using an n-well definition step in a CMOS process;
   b) the semiconductor substrate being p-type silicon; and
   c) the barrier being a layer of substrate which is counterdoped sufficiently to be n-type silicon.

20. Semiconductor circuit device as described in claim 18, further characterized by:
   a) the barrier being obtained by using a p-well definition step in a CMOS process;
   b) the semiconductor substrate being n-type silicon; and
   c) the barrier being a layer of substrate which is counterdoped sufficiently to be p-type silicon.

21. Semiconductor circuit device as described in claim 18, further characterized by:
   said capacitor being located on a portion of the semiconductor circuit device which is at a perimeter of the substrate.

22. Semiconductor circuit device as described in claim 18, further characterized by:

said capacitors being depletion mode capacitors.

23. A semiconductor circuit device in which a plurality of active circuit devices are arrayed on a semiconductive substrate in a CMOS configuration, and a plurality of conductive lines extend along the substrate between the active devices and external connection points on the die containing the semiconductor substrate, within a package containing external connection conductors extending within the package from the external connection points and having a significant inductive characteristics, characterized by:

a) said conductive lines being circuit busses for circuits on the semiconductor device;
b) said conductive lines being metal conductors;
c) one of said conductive lines being maintained at a regulated potential;
d) at least one well consisting of a material of opposite conductivity type as the substrate, achieved by doping to provide an opposite difference from four valence electrons as the substrate;
e) a capacitor defined by an active area of the substrate and a polysilicon layer;
f) the capacitor being provided with a barrier to substrate, the barrier consisting of a material of opposite conductivity type as the substrate, achieved by providing said capacitor within said well which had been doped to provide an opposite difference from four valence electrons as the substrate, whereby said doped well forms said barrier;
g) the capacitor occupying a space defined by a plurality of the conductive lines;
h) the capacitor being in electrical communication with at least one of said lines, wherein the capacitor is located on the substrate in an area which is unoccupied by said active circuit devices, wherein one node is tied directly to substrate and the other node to one of said plurality of conductive lines as an on-chip power bus decoupling capacitor, thereby adding filter capacitance to the semiconductor circuit device in order to provide protection from voltage transients which may occur at the external connection points as a result of said inductive characteristics of the external connection conductors; and
i) an additional capacitor located on the substrate in an area which is unoccupied by said active circuit device and connected in series with said capacitor in electrical communication with said conductive line which is maintained at the regulated potential, the additional capacitor sharing a common electrode plate which extends across said unoccupied area between the two capacitors.

24. Semiconductor circuit device as described in claim 23, further characterized by:

said capacitors being depletion mode capacitors.

25. Semiconductor circuit device as described in claim 23, further characterized by:

a) the barrier being obtained by using an n-well definition step in a CMOS process;
b) the semiconductor substrate being p-type silicon; and
c) the barrier being a layer of substrate which is counterdoped sufficiently to be n-type silicon.

26. Semiconductor circuit device as described in claim 23, further characterized by:

a) the barrier being obtained by using a p-well definition step in a CMOS process;
b) the semiconductor substrate being n-type silicon; and
c) the barrier being a layer of substrate which is counterdoped sufficiently to be p-type silicon.

27. Semiconductor circuit device as described in claim 23, further characterized by:

the capacitors being in electrical communication between two of said conductive lines, wherein both of said lines remains in electrical communication with the external connection points, and wherein the capacitors filter inductively induced transients on the semiconductor device during the operation of the semiconductor circuit device.

28. Semiconductor circuit device as described in claim 23, further characterized by:

the semiconductor circuit device including a randomly accessed memory array, in which stored data is communicated by high and low state signals and said capacitors are connected between a VSS circuit and a VCC circuit.

29. Semiconductor circuit device as described in claim 23, further characterized by:

a) said active circuit devices and said conductive lines being located on a face side of the substrate of the semiconductor circuit device; and
b) said capacitors being located on the face side.

30. Semiconductor circuit device as described in claim 29, further characterized by:

said capacitors being located on a portion of the semiconductor circuit device which is at a perimeter of the substrate.

31. Semiconductor circuit device as described in claim 23, further characterized by:

said capacitors being located on a portion of the semiconductor circuit device which is in a border area between adjacent regions of active circuitry on the semiconductor device.

32. A semiconductor circuit device in which a plurality of active circuit devices are arrayed on a semiconductive substrate in a CMOS configuration, and a plurality of conductive lines extend along the substrate between the active devices and external connection points on the die containing the semiconductor substrate, within a package containing external connection conductors extending within the package from the external connection points and having a significant inductive characteristics, characterized by:

a) said conductive lines being circuit busses for circuits on the semiconductor device;
b) said conductive lines being metal conductors;
c) said conductive lines being maintained at a regulated potential;
d) at least one well consisting of a material of opposite conductivity type as the substrate, achieved by doping to provide an opposite difference from four valence electrons as the substrate;
e) a capacitor defined by an active area of the substrate and a polysilicon layer;
f) the capacitor being provided with a barrier to substrate, the barrier consisting of a material of opposite conductivity type as the substrate, achieved by providing said capacitor within said well which had been doped to provide an opposite difference from four valence electrons as the substrate, whereby said doped well forms said barrier;

g) the capacitor occupying a space defined by a plurality of the conductive lines;
h) the capacitor being in electrical communication with at least one of said lines, wherein the capacitor is located on the substrate in an area which is unoccupied by said active circuit devices, wherein one node is tied directly to substrate and the other node to one of said plurality of conductive lines as an on-chip power bus decoupling capacitor, thereby adding filter capacitance to the semiconductor circuit device in order to provide protection from voltage transients which may occur at the external connection points as a result of said inductive characteristics of the external connection conductors;
i) an additional capacitor located on the substrate in an area which is unoccupied by said active circuit device and connected in series with said capacitor in electrical communication with said conductive line which is maintained at the regulated potential; and
j) said capacitors being depletion mode capacitors.

33. Semiconductor circuit device as described in claim 32, further characterized by:
a) the barrier being obtained by using an n-well definition step in a CMOS process;
b) the semiconductor substrate being p-type silicon; and
c) the barrier being a layer of substrate which is counterdoped sufficiently to be n-type silicon.

34. Semiconductor circuit device as described in claim 32, further characterized by:
a) the barrier being obtained by using a p-well definition step in a CMOS process;
b) the semiconductor substrate being n-type silicon; and
c) the barrier being a layer of substrate which is counterdoped sufficiently to be p-type silicon.

35. Semiconductor circuit device as described in claim 32, further characterized by:
the capacitors being in electrical communication between two of said conductive lines, wherein both of said lines remains in electrical communication with the external connection points, and wherein the capacitors filter inductively induced transients on the semiconductor device during the operation of the semiconductor circuit device.

36. Semiconductor circuit device as described in claim 32, further characterized by:
the semiconductor circuit device including a randomly accessed memory array, in which stored data is communicated by high and low state signals and said capacitors are connected between a VSS circuit and a VCC circuit.

37. Semiconductor circuit device as described in claim 32, further characterized by:
a) said active circuit devices and said conductive lines being located on a face side of the substrate of the semiconductor circuit device; and
b) said capacitors being located on the face side.

38. Semiconductor circuit device as described in claim 37, further characterized by:
said capacitors being located on a portion of the semiconductor circuit device which is at a perimeter of the substrate.

39. Semiconductor circuit device as described in claim 32, further characterized by:
said capacitors being located on a portion of the semiconductor circuit device which is in a border area between adjacent regions of active circuitry on the semiconductor device.

* * * * *

UNITED STATES PATENT AND TRADEMARK OFFICE
CERTIFICATE OF CORRECTION

PATENT NO. : 5,032,892
DATED : July 16, 1991
INVENTOR(S) : Wen-Foo Chern, Ward M. Parkinson, Thomas M. Trent, Kevin G. Duesman, James E. O'Toole It is certified that error appears in the above-indentified patent and that said Letters Patent is hereby corrected as shown below:

Column 1, line 50, delete "VCC" and insert -- $V_{cc}$ --;

Column 1, line 53, delete "ICI" and insert -- IC1 --;

Column 3, line 4, delete "breaks" and insert -- break --;

Column 3, line 6, delete "an" and insert -- a --;

Column 3, line 9, delete "step" and insert -- steps --;

Column 3, line 65, delete "Vss" and insert -- $V_{ss}$ --;

Column 4, line 46, delete "Vss" and insert -- $V_{ss}$ --;

Column 5, line 4, delete "formation" and insert -- formation. n --;

Column 8, line 41, delete "are" and insert -- area --;

UNITED STATES PATENT AND TRADEMARK OFFICE
CERTIFICATE OF CORRECTION

PATENT NO. : 5,032,892
DATED : July 16, 1991
INVENTOR(S) : Wen-Foo Chern, Ward M. Parkinson, Thomas M. Trent, Kevin G. Duesman, James E. O'Toole It is certified that error appears in the above-indentified patent and that said Letters Patent is hereby corrected as shown below:

Column 10, line 21, delete "VSS" and insert -- $V_{ss}$ --;

Column 10, line 22, delete "VCC" and insert -- $V_{cc}$ --;

Column 12, line 17, delete "VSS" and insert -- $V_{ss}$ --;

Column 12, line 18, delete "VCC" and insert -- $V_{cc}$ --;

Signed and Sealed this

Thirty-first Day of May, 1994

BRUCE LEHMAN

*Attest:*

*Attesting Officer*  *Commissioner of Patents and Trademarks*